(12) United States Patent
Takebayashi et al.

(10) Patent No.: US 12,243,729 B2
(45) Date of Patent: Mar. 4, 2025

(54) MEMBER FOR SEMICONDUCTOR MANUFACTURING APPARATUS AND METHOD FOR MANUFACTURING THE SAME

(71) Applicant: NGK Insulators, Ltd., Nagoya (JP)

(72) Inventors: Hiroshi Takebayashi, Handa (JP); Joyo Ito, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 187 days.

(21) Appl. No.: 18/145,871

(22) Filed: Dec. 23, 2022

(65) Prior Publication Data

US 2023/0125679 A1   Apr. 27, 2023

Related U.S. Application Data

(63) Continuation of application No. PCT/JP2021/037206, filed on Oct. 7, 2021.

(30) Foreign Application Priority Data

Feb. 4, 2021  (JP) ................. 2021-016207

(51) Int. Cl.
*H01L 21/683* (2006.01)
*H01J 37/32* (2006.01)

(52) U.S. Cl.
CPC .... *H01J 37/32724* (2013.01); *H01L 21/6833* (2013.01); *H01J 2237/0206* (2013.01);
(Continued)

(58) Field of Classification Search
CPC ..... H01L 21/683; H01L 21/6831–6833; H01L 21/67103; H01L 21/67248;
(Continued)

(56) References Cited

U.S. PATENT DOCUMENTS

2005/0036268 A1  2/2005  Howald et al.
2005/0215073 A1  9/2005  Nakamura et al.
(Continued)

FOREIGN PATENT DOCUMENTS

JP   H06-036583 Y2   9/1994
JP   H09-172056 A    6/1997
(Continued)

OTHER PUBLICATIONS

Taiwanese Office Action dated May 27, 2024 (Application No. 110138106).
(Continued)

*Primary Examiner* — Tuan T Dinh
(74) *Attorney, Agent, or Firm* — BURR PATENT LAW, PLLC

(57) ABSTRACT

A member for semiconductor manufacturing apparatus includes: an upper plate that has a wafer placement surface, contains no electrode, and is a ceramic material plate; an intermediate plate that is provided on a surface of the upper plate, opposite to the wafer placement surface, that is used as an electrostatic electrode, and that is a conductive material plate; and a lower plate that is joined to a surface of the intermediate plate, opposite to the surface on which the upper plate is provided, and that is a ceramic material plate.

11 Claims, 5 Drawing Sheets

(52) U.S. Cl.
CPC ............... *H01J 2237/0262* (2013.01); *H01J 2237/2007* (2013.01); *H01J 2237/334* (2013.01)

(58) Field of Classification Search
CPC .......... H01L 21/68757; H01L 21/68785; H01J 37/3255; H01J 37/32715; H01J 37/32724
USPC .................................................. 361/231–234
See application file for complete search history.

(56) References Cited

U.S. PATENT DOCUMENTS

| | | | |
|---|---|---|---|
| 2007/0199660 A1* | 8/2007 | Yokoyama | H01L 21/6833 438/689 |
| 2010/0156055 A1 | 6/2010 | Saito et al. | |
| 2011/0092072 A1 | 4/2011 | Singh et al. | |
| 2011/0297082 A1 | 12/2011 | Watanabe et al. | |
| 2013/0072035 A1 | 3/2013 | Gaff et al. | |
| 2014/0042716 A1 | 2/2014 | Miura et al. | |
| 2015/0043122 A1* | 2/2015 | Eto | H01L 21/67103 156/196 |
| 2015/0077895 A1 | 3/2015 | Jindo et al. | |
| 2016/0172226 A1* | 6/2016 | West | C23C 16/46 118/724 |
| 2016/0343600 A1 | 11/2016 | Parkhe | |
| 2018/0053678 A1 | 2/2018 | Kugimoto | |
| 2018/0190529 A1* | 7/2018 | Takebayashi | H01J 37/32724 |
| 2018/0218885 A1 | 8/2018 | Maeda et al. | |
| 2018/0269097 A1* | 9/2018 | Maeta | H01L 21/6831 |
| 2019/0088517 A1 | 3/2019 | Kosakai et al. | |
| 2019/0096639 A1* | 3/2019 | Takahashi | H01J 37/32091 |
| 2020/0406499 A1* | 12/2020 | Nobori | B28B 11/243 |

FOREIGN PATENT DOCUMENTS

| | | |
|---|---|---|
| JP | 2003-264223 A | 9/2003 |
| JP | 2005-277074 A | 10/2005 |
| JP | 2010-021559 A | 1/2010 |
| JP | 2010-040644 A | 2/2010 |
| JP | 2010-153490 A | 7/2010 |
| JP | 2011-049196 A | 3/2011 |
| JP | 2011-258614 A | 12/2011 |
| JP | 5666748 B1 | 2/2015 |
| JP | 2016-171185 A | 9/2016 |
| JP | 2017-163157 A | 9/2017 |
| JP | 2018-518833 A | 7/2018 |
| JP | 2018-123348 A | 8/2018 |
| KR | 10-2012-0103596 A | 9/2012 |
| KR | 10-2014-0012730 A | 2/2014 |
| KR | 10-2014-0063840 A | 5/2014 |
| TW | 201804564 A | 2/2018 |

OTHER PUBLICATIONS

International Search Report and Written Opinion (Application No. PCT/JP2021/037206) dated Dec. 21, 2021.
English translation of the International Preliminary Report on Patentability (Chapter 1) dated Aug. 17, 2023 (Application No. PCT/JP2021/037206).
Korean Office Action (with English translation) dated May 27, 2024 (Application No. 10-2022-7045178).

* cited by examiner

MEMBER FOR SEMICONDUCTOR MANUFACTURING APPARATUS AND METHOD FOR MANUFACTURING THE SAME

BACKGROUND OF THE INVENTION

1. Field of the Invention

The present invention relates to a member for semiconductor manufacturing apparatus and method for manufacturing the same.

2. Description of the Related Art

A known member for semiconductor manufacturing apparatus includes an upper plate that contains an electrostatic electrode and a heater electrode and that is a ceramic material plate, an intermediate plate that is joined to a surface of the upper plate opposite a wafer placement surface with a first metal joining layer interposed therebetween and that is a metal matrix material plate, and a lower plate that is joined to a surface of the intermediate plate opposite a surface that is joined to the upper plate with a second metal joining layer interposed therebetween and that is a ceramic material plate (for example, PTL 1). In PTL 1, an upper puck plate corresponds to the upper plate, a lower puck plate corresponds to the intermediate plate, and a backing plate corresponds to the lower plate.

CITATION LIST

Patent Literature

PTL 1: JP 2018-518833 A

SUMMARY OF THE INVENTION

However, in the above-described member for semiconductor manufacturing apparatus, an electrostatic electrode is contained in the upper plate, thus a variation may occur in the thickness of a portion (dielectric layer) of the upper plate, the portion being above the electrostatic electrode. Specifically, when the surface of the upper plate is ground, the upper plate may be deformed and the thickness of the dielectric layer may be varied due to embedding of the electrostatic electrode, near the wafer placement surface, of the upper plate, and/or a difference in thermal expansion coefficient between the electrostatic electrode and the ceramics of which the upper plate is composed. When the thickness of the dielectric layer is varied within the surface, it is not preferable because a wafer attracting force varies within the surface, and upon generation of plasma, the plasma density varies within the surface. When the thickness of the dielectric layer is small, these unfavorable effects are likely to be noticeable.

The present invention has been accomplished to solve the problems, and it is a main object of the present invention to provide a member for semiconductor manufacturing apparatus, that includes an upper plate, an intermediate plate, and a lower plate which are joined to each other, and that has favorable uniformity of the thickness of the upper plate even when the upper plate is thin.

The member for semiconductor manufacturing apparatus of the present invention includes: an upper plate that has a wafer placement surface, contains no electrode, and is a ceramic material plate; an intermediate plate that is provided on a surface of the upper plate, opposite to the wafer placement surface, that is used as an electrostatic electrode and an RF electrode, and that is a conductive material plate; and a lower plate that is joined to a surface of the intermediate plate, opposite to a surface on which the upper plate is provided, and that is a ceramic material plate.

In this member for semiconductor manufacturing apparatus, the ceramic upper plate containing no electrode functions as a dielectric layer of an electrostatic chuck. Since the upper plate contains no electrode, the upper plate is easily made flat, as compared to when the upper plate contains an electrode. For this reason, even when the upper plate (that is, the dielectric layer) is thin, uniformity of the thickness of the upper plate is improved. Thus, joining characteristics between the upper plate and the intermediate plate are improved, and residual stress after joining is also reduced. In addition, when a plasma is generated by applying an RF voltage to the intermediate plate, plasma density can be prevented from varying within the surface of the upper plate.

Note that in the present specification, the words "upper" and "lower" do not represent an absolute positional relationship but represents a relative positional relationship. For this reason, the words "upper" and "lower" represent "lower" and "upper", "left" and "right", or "front" and "rear" depending on the direction of the member for semiconductor manufacturing apparatus.

In the member for semiconductor manufacturing apparatus of the present invention, the thickness of the upper plate may be not less than 0.05 mm and not more than 1.5 mm. It is preferable to set the thickness to a value in this range, which allows desired attracting and releasing characteristics to be obtained. Setting the thickness of the upper plate to a value in the above-mentioned range increases the electrostatic capacitance of the upper plate, and accordingly, the impedance of the upper plate is reduced, thus it is advantageous in the viewpoint of generation of plasma.

In the member for semiconductor manufacturing apparatus of the present invention, the lower plate may contain a heater electrode. In this setting, since the intermediate plate is present between the lower plate containing a heater electrode and the wafer placement surface, heat is diffused by the intermediate plate and conducted to the wafer. Thus, the uniform thermal characteristics of the wafer is improved. In this case, the lower plate may contain a shield electrode between the surface on which the intermediate plate is provided and the heater electrode. In this manner, the shield electrode prevents the RF current from flowing into the heater electrode, thus the RF current can be prevented from exerting an adverse effect on temperature control of the heater electrode.

In the member for semiconductor manufacturing apparatus of the present invention, the diameter of the intermediate plate may be larger than the diameter of the upper plate. In this setting, a plasma generation area is expanded, as compared to when the diameter of the intermediate plate is smaller than or equal to the diameter of the upper plate, thus the wafer is easily processed with plasma uniformly.

In the member for semiconductor manufacturing apparatus of the present invention, outwardly exposed faces of the intermediate plate may be covered with an insulating film. In this manner, the outwardly exposed faces of the intermediate plate can be prevented from corrosion. When the member for semiconductor manufacturing apparatus of the present invention has a first metal joining layer that joins the upper plate and the intermediate plate, and a second metal joining layer that joins the lower plate and the intermediate plate, it is preferable that outwardly exposed portions of the first metal joining layer and outwardly exposed portions of the second metal joining layer be covered with an insulating film. In this manner, those portions can be prevented from corrosion.

In the member for semiconductor manufacturing apparatus of the present invention, the intermediate plate may be a metal plate or a metal-ceramic-composite material plate, and the lower plate and the upper plate may be the same ceramic material plate.

The member for semiconductor manufacturing apparatus of the present invention may have a through-hole that penetrates the member for semiconductor manufacturing apparatus in a thickness direction, and electrical discharge prevention treatment may be already performed on the through-hole. In this manner, the occurrence of electrical discharge via the through-hole can be prevented while the wafer is being processed. Note that the electrical discharge prevention treatment includes, for example, covering a conductive material exposed portion of the inner wall of the through-hole with an insulating film or an insulating tube, and for the through-hole serving as a gas hole, bonding and fixing an air permeable plug with resin to at least a portion of the hole, the portion penetrating the upper plate.

The method for manufacturing a member for semiconductor manufacturing apparatus of the present invention may include: (a) a step of preparing an upper plate that has a wafer placement surface, contains no electrode, and is a ceramic plate, a lower plate that is a ceramic plate, and an intermediate plate that is a conductive material plate; and (b) a step of disposing a first metal joining material between an upper surface of the intermediate plate and a surface of the upper plate, opposite to the wafer placement surface, disposing a second metal joining material between a lower surface of the intermediate plate and an upper surface of the lower plate, and obtaining a joined body by applying heat under pressure in a current state and cooling to a room temperature, or may include: (a) a step of forming an upper plate that is a ceramic material plate by thermal spray on an upper surface of an intermediate plate that is a conductive material plate; and (b) a step of disposing a metal joining material between a lower surface of the intermediate plate and an upper surface of a lower plate that is a ceramic material plate, and obtaining a joined body by applying heat under pressure in a current state and cooling to a room temperature.

The method for manufacturing a member for semiconductor manufacturing apparatus is suitable for producing the above-described member for semiconductor manufacturing apparatus.

DETAILED DESCRIPTION OF THE INVENTION

Figure 1:
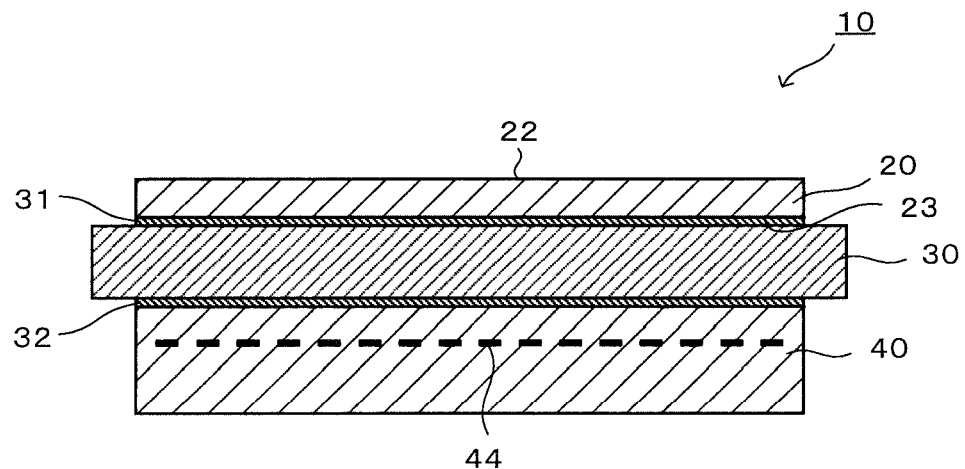
FIG. 1 is a sectional view of a member 10 for semiconductor manufacturing apparatus.
Figure 2:
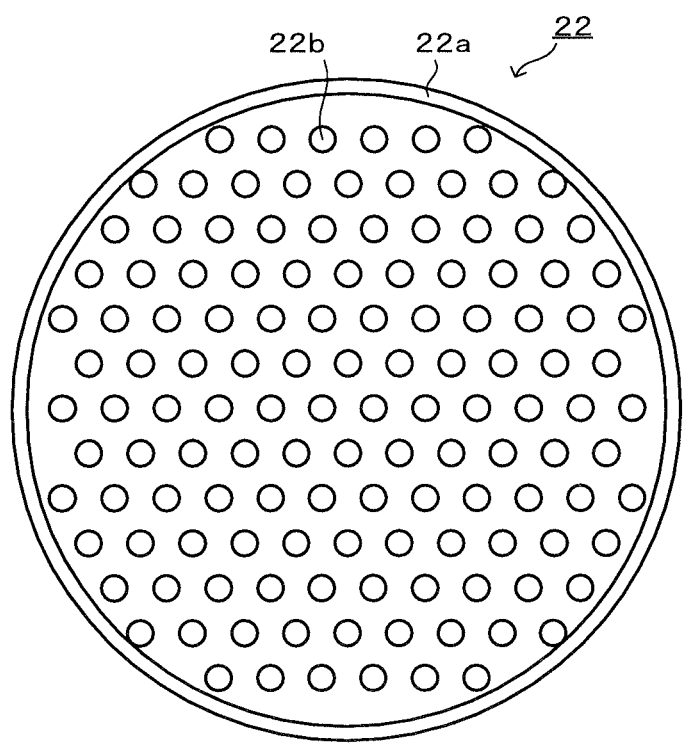
FIG. 2 is a plan view of a wafer placement surface 22.
Figure 3:
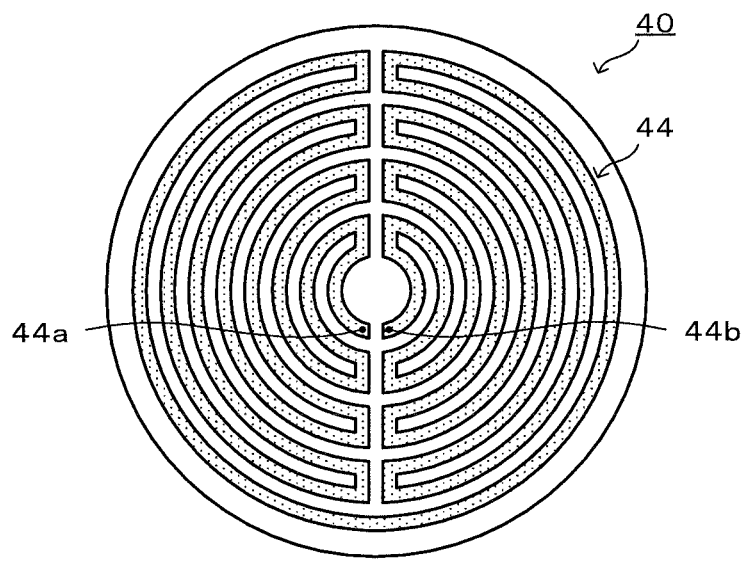
FIG. 3 is a plan view of an example of a heater electrode 44.

A preferred embodiment of the present invention will now be described with reference to the drawings. FIG. 1 is a sectional view of a member for semiconductor manufacturing apparatus 10 (a sectional view taken along a vertical plane that passes through the center of the member 10). FIG. 2 is a plan view of a wafer placement surface 22. FIG. 3 is a plan view of an example of a heater electrode 44.

As illustrated in FIG. 1, the member for semiconductor manufacturing apparatus 10 includes an upper plate 20, an intermediate plate 30, a lower plate 40, and first and second metal joining layers 31 and 32.

The upper plate 20 is a ceramic (for example, alumina or aluminum nitride) plate that has a disk shape and has a diameter equal to that of a silicon wafer W on which a plasma process is to be performed, and that contains no electrode. For example, the diameter of the upper plate 20 may be, but not particularly limited to, 250 to 350 mm. The upper surface of the upper plate 20 is the wafer placement surface 22. As illustrated in FIG. 2, a seal band 22a is formed on the wafer placement surface 22 along the outer edge, and circular projections 22b are formed over the entire surface. The seal band 22a and the circular projections 22b have the same height, and the height thereof is, for example, several μm to several tens of μm.

The intermediate plate 30 has a disk shape and has a diameter larger than the diameters of the upper plate 20 and the lower plate 40. The intermediate plate 30 is joined to a surface 23 of the upper plate 20 with the first metal joining layer 31 interposed therebetween, the surface 23 being opposite to the wafer placement surface 22. Examples of material for the intermediate plate 30 include a conductive material (composite material and metal). An example of the composite material is a metal matrix composite material (also referred to as a metal matrix composite (MMC)). Examples of the MMC include a material containing Si, SiC, and Ti (also referred to as SiSiCTi) and a material obtained by impregnating a SiC porous body with Al and/or Si. Examples of the metal include Ti and Mo.

A direct current (DC) voltage can be applied to the intermediate plate 30 by an external DC power supply 70 (see FIG. 4) via a power supply terminal which is not illustrated. The upper plate 20 functions as a dielectric layer. The thickness of the upper plate 20 is adjusted to a predetermined thickness (for example, 50 to 500 μm) in consideration of the force for attracting the wafer W. When the DC voltage is applied to the intermediate plate 30, the wafer W placed on the wafer placement surface 22 is attracted and secured to the wafer placement surface 22. When application of the DC voltage is stopped, the wafer that is attracted and secured to the wafer placement surface 22 is released. The back surface of the wafer W that is attracted to the wafer placement surface 22 comes into contact with the upper surface of the seal band 22a and the upper surfaces of the circular projections 22b. There are spaces between the back surface of the wafer W and portions of the wafer placement surface 22 on which neither the seal band 22a nor the circular projections 22b are disposed. A heat-transfer gas (for example, He gas) is supplied to the spaces via a gas supply path that extends through the member 10 for semiconductor manufacturing apparatus in the vertical direction and that is not illustrated. The heat-transfer gas enables the upper plate 20 and the wafer W to efficiently exchange heat.

An RF voltage can be applied to the intermediate plate 30 by an external radio-frequency (RF) power supply 74 (see FIG. 4) via a power supply terminal which is not illustrated. An upper electrode (not illustrated) including a shower head is disposed above the wafer placement surface 22 of the member 10 for semiconductor manufacturing apparatus spaced from the wafer placement surface 22. The upper electrode is connected to the ground, and a reactive gas is supplied to the space between the wafer placement surface 22 and the upper electrode. When an RF voltage is applied to the intermediate plate 30 while a reactive gas is being supplied to the space, a plasma is generated between the upper plate 20 and the upper electrode.

The lower plate 40 is a ceramic plate that has a diameter equal to that of the upper plate 20 and that has a disk shape and contains the heater electrode 44. The lower plate 40 is joined to the surface of the intermediate plate 30 opposite the surface that is joined to the upper plate 20 with the second metal joining layer 32 interposed therebetween. As illustrated in FIG. 3, the heater electrode 44 is formed in a one-stroke pattern from an end 44a to another end 44b so as to extend over substantially the entire surface in the region of the lower plate 40 in a plan view, generates heat when a voltage is applied, and heats the wafer W. A region in which the heater electrode 44 extends is a circular region in a plan view. The heater electrode 44 can apply a voltage by using a heater power supply via the power supply terminal that is connected to the end 44a and the other end 44b and that is not illustrated.

When the materials of the upper plate 20 and the lower plate 40 are alumina, the material of the intermediate plate 30 is preferably SiSiCTi or metal Ti. When the material of the upper plate 20 is alumina, the thickness of the upper plate 20 is preferably not less than 0.05 mm and not more than 0.65 mm, more preferably not less than 0.2 mm and not more than 0.4 mm. When the materials of the upper plate 20 and the lower plate 40 are aluminum nitride, the material of the intermediate plate 30 is preferably a material obtained by impregnating a SiC porous body with Si or metal Mo. When the material of the upper plate 20 is aluminum nitride, the thickness of the upper plate 20 is preferably not less than 0.1 mm and not more than 1.5 mm, more preferably not less than 0.3 mm and not more than 0.7 mm.

The first and second metal joining layers 31 and 32 are composed of a material containing Al such as an Al—Si—Mg or Al—Mg material. The thicknesses of the first and second metal joining layers 31 and 32 are not particularly limited but are preferably 1 to 300 µm, more preferably 50 to 150 µm. The outer circumference of the first metal joining layer 31 preferably does not protrude from the outer circumference of the upper plate 20. The outer circumference of the second metal joining layer 32 preferably does not protrude from the outer circumference of the lower plate 40. The first and second metal joining layers 31 and 32 are formed by, for example, TCB (Thermal compression bonding). The TCB is a known method for compressing and joining two members in a state in which the two members to be joined interpose the metal joining materials therebetween and are heated to a temperature equal to or less than the solidus temperature of the metal joining materials.

Figure 4:
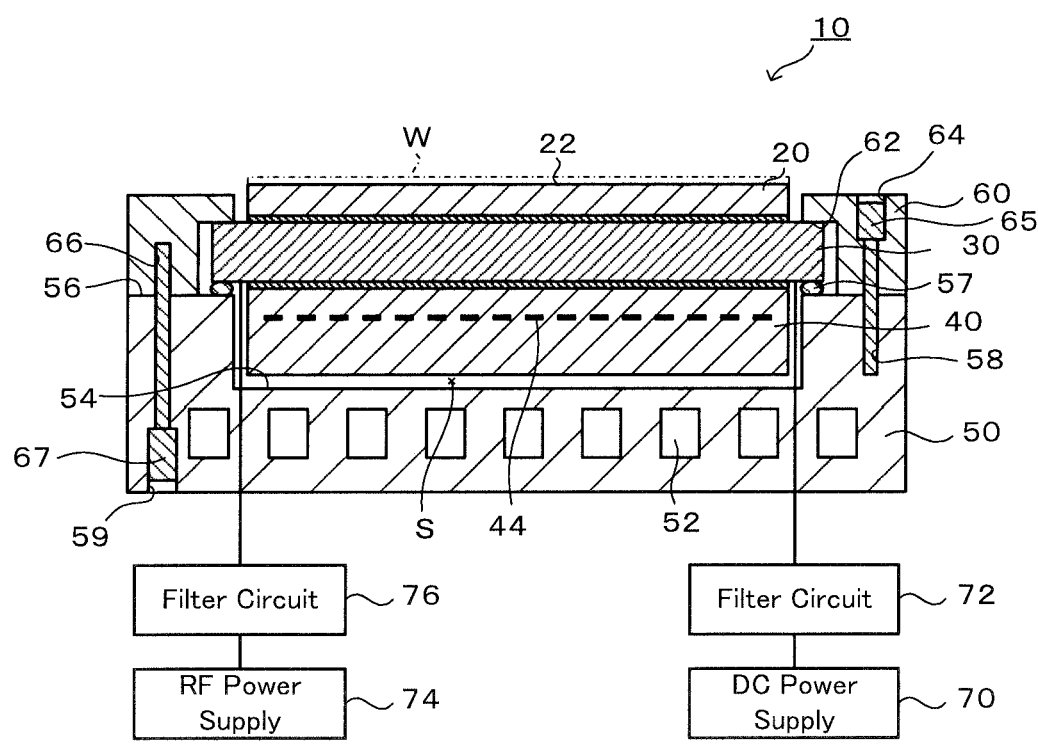
FIG. 4 is a sectional view illustrating the manner in which the member 10 for semiconductor manufacturing apparatus is mounted on a cooling device 50.

An example of the use of the member 10 for semiconductor manufacturing apparatus will now be described. FIG. 4 is a sectional view illustrating the manner in which the member 10 for semiconductor manufacturing apparatus is mounted on a cooling device 50. The member 10 for semiconductor manufacturing apparatus is mounted on the cooling device 50 that is installed in a vacuum chamber which is not illustrated. The cooling device 50 is a disk member composed of metal such as aluminum and contains a refrigerant passage 52 through which refrigerant can circulate. A circular groove 54 is formed at the center of the upper surface of the cooling device 50. The lower plate 40 is inserted in the circular groove 54. The cooling device 50 has an annular surface 56 that surrounds the circumference of the circular groove 54. The member 10 for semiconductor manufacturing apparatus is secured to the cooling device 50 by using a clamp ring 60 in a state in which a seal member 57 that has a ring shape is disposed between an outer circumferential portion of the lower surface of the intermediate plate 30 and the annular surface 56, and the lower plate 40 is inserted in the circular groove 54. The outer diameter of the seal member 57 is larger than the diameter of the circular groove 54 and is smaller than the diameter of the intermediate plate 30. An example of the seal member 57 is a metal gasket. The clamp ring 60 is disposed on the annular surface 56 of the cooling device 50. An inner circumferential surface of the clamp ring 60 has a step 62, which presses the upper surface of an outer circumferential portion of the intermediate plate 30 from above. The clamp ring 60 has vertical holes 64 in which screws 65 can be inserted and screw holes 66 in which screws 67 can be screwed. The screws 65 are inserted in the vertical holes 64 from above and are screwed in screw holes 58 that are formed in the annular surface 56 of the cooling device 50. The screws 67 are inserted in screw insertion holes 59 that extend through the cooling device 50 in the vertical direction from below and are screwed in the screw holes 66 that are formed in the back surface of the clamp ring 60. The multiple (for example, eight) screws 65 and 67 are arranged in the circumferential direction of the clamp ring 60 at regular intervals. Consequently, a space S that is surrounded by the circular groove 54, the lower plate 40, and the seal member 57 is sealed. The sealed space S is filled with a heat-transfer sheet or a heat-transfer gas. A portion of the intermediate plate 30 of the member 10 for semiconductor manufacturing apparatus is thus used as a flange for mounting on the cooling device 50, the portion protruding outward from the upper plate 20 and the lower plate 40. Subsequently, the intermediate plate 30 is connected to the DC power supply 70 via a filter circuit 72 as well as to the RF power supply 74 via a filter circuit 76. The filter circuit 72 prevents the RF current from flowing into the DC power supply 70 from the intermediate plate 30. The filter circuit 76 prevents the DC current from flowing into the RF power supply 74 from the intermediate plate 30.

After the member 10 for semiconductor manufacturing apparatus is mounted on the cooling device 50, the wafer W is placed on the wafer placement surface 22. The pressure in the vacuum chamber is decompressed by a vacuum pump and is adjusted such that a predetermined degree of vacuum is achieved. A DC voltage is applied to the intermediate plate 30 using the DC power supply 70, and the wafer W is attracted and secured to the wafer placement surface 22. The wafer W comes into close contact with the seal band 22a and the circular projections 22*b* (see FIG. 2) on the wafer placement surface 22 without a gap. Consequently, the spaces between the back surface of the wafer W and the portions of the wafer placement surface 22 on which neither the seal band 22*a* nor the circular projections 22*b* are disposed are sealed. The heat-transfer gas is supplied to the spaces. The heat-transfer gas is enclosed, and accordingly, heat is efficiently conducted between the upper plate 20 and the wafer W. Subsequently, a reactive gas atmosphere at a predetermined pressure (for example, several tens of Pa to several hundreds of Pa) is created in the vacuum chamber. A reactive gas is supplied from the shower head of the upper electrode which is not illustrated. In this state, an RF voltage is applied to the intermediate plate 30 using the RF power supply 74 to generate a plasma between the upper electrode and the upper plate 20. The surface of the wafer W is then etched by the generated plasma. A controller, not illustrated, controls the electric power supplied to the heater electrode 44 so that the temperature of the wafer W reaches a predetermined target temperature.

An example in which the member for semiconductor manufacturing apparatus 10 is manufactured will now be described. FIGS. 5A to 5D illustrate manufacturing process diagrams of the member for semiconductor manufacturing apparatus 10. In the example described below, the materials of the upper plate 20 and the lower plate 40 are alumina, and the material of the intermediate plate 30 is SiSiCTi.

Figure 5A:
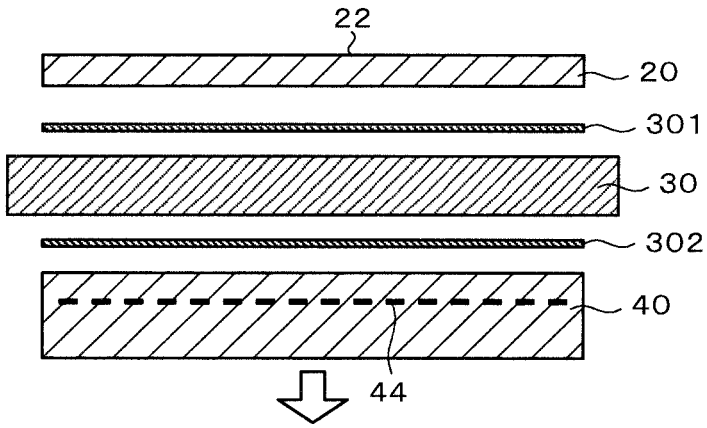
FIGS. 5A to 5D illustrate manufacturing process diagrams of the member 10 for semiconductor manufacturing apparatus.
Figure 5B:
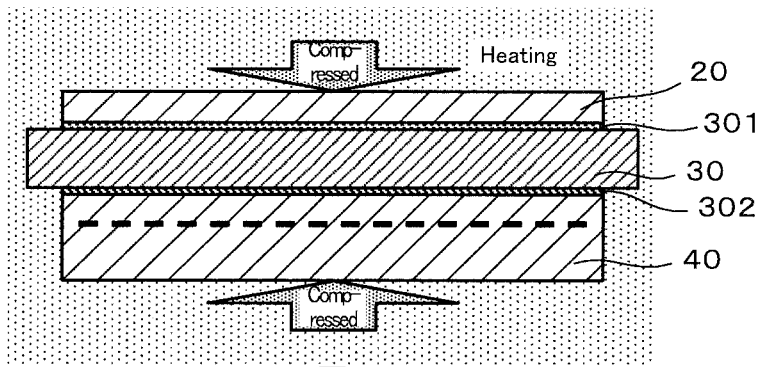
Figure 5C:
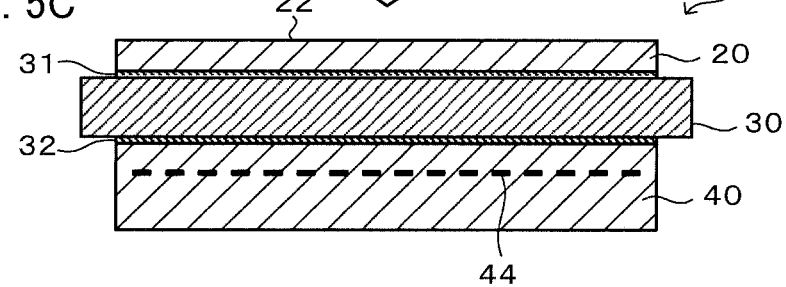
Figure 5D:
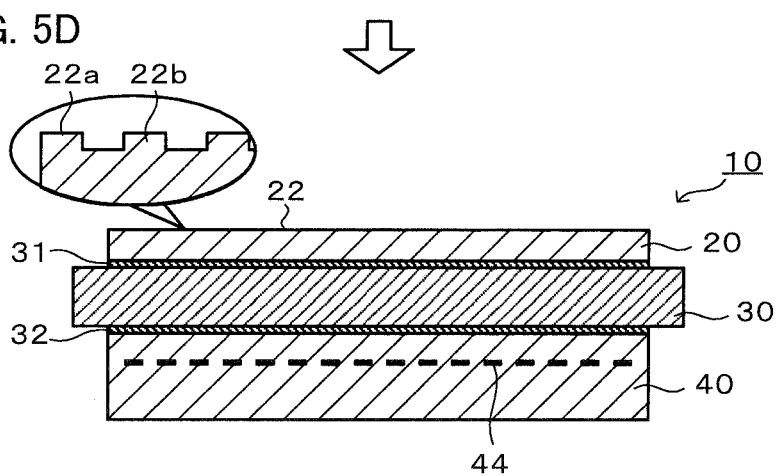

The upper plate 20, the intermediate plate 30, and the lower plate 40 are first prepared (see FIG. 5A). This step is referred to as a step (a).

The upper plate 20 can be manufactured in the following manner. An example of manufacturing the upper plate 20 that is an alumina material plate will be described herein. A MC sheet that has a disk shape and is an alumina material sheet is first prepared. MC is an abbreviation for mold cast and refers to a known method of obtaining a molded body by injecting ceramic slurry that contains ceramic material powder (here, alumina material powder) and a molding agent into a mold, causing the molding agent to chemically react in the mold, and molding the ceramic slurry. An example of the molding agent contains isocyanate and a polyol and is molded by a urethane reaction. Subsequently, the MC sheet is fired by a hot press method, and consequently, an alumina sintered body is obtained. The shape and the thickness are adjusted by performing, for example, the grinding process or the blasting process on both surfaces of the obtained alumina sintered body, and the upper plate 20 that has a flat plate shape is obtained (see FIG. 5A). At this point of time, the seal band 22*a* and the circular projections 22*b* are not formed on the wafer placement surface 22. Green sheets may be used instead of the alumina MC sheets.

The intermediate plate 30 can be manufactured in the following manner. In an example describe herein, the intermediate plate 30 that is a SiSiCTi material plate is manufactured. A disk member composed of SiSiCTi is first prepared. For example, a powder mixture is prepared so as to contain 39 to 51 mass % of silicon carbide material particles that have an average particle diameter of no less than 10 μm and no more than 25 μm and so as to contain one or more kinds of materials that are selected such that the materials contain Ti and Si, and such that a mass ratio of Si/(Si+Ti) regarding Si and Ti that are derived from materials except for silicon carbide is 0.26 to 0.54. Examples of the materials can be silicon carbide, metal Si, and metal Ti. In this case, the materials are preferably mixed such that 39 to 51 mass % of silicon carbide, 16 to 24 mass % of metal Si, and 26 to 43 mass % of metal Ti are contained. Subsequently, a molded body that has a disk shape is prepared from the obtained powder mixture by uniaxial pressing molding, the molded body is sintered at 1370 to 1460° C. in an inert atmosphere by hot pressing, and consequently, the disk member that is a SiSiCTi material member is obtained. Pressure during the hot pressing is set to, for example, 50 to 300 kgf/cm². Subsequently, the shape and thickness of the obtained disk member are adjusted by, for example, the grinding process, and the intermediate plate 30 is obtained (see FIG. 5A). Specific conditions in which the intermediate plate 30 is manufactured may be set by referring conditions disclosed in, for example, Japanese Patent No. 5666748.

The lower plate 40 can be manufactured in the following manner. An example of manufacturing the lower plate 40 that is an alumina material plate will be described herein. First and second MC sheets that have a disk shape and are alumina material sheets are first prepared. Subsequently, the heater electrode 44 is formed on the surface of the second MC sheet. Examples of a method for forming the heater electrode 44 can include screen printing, PVD, CVD, and plating. Subsequently, the first MC sheet is stacked on the surface, on which the heater electrode 44 is formed, of the second MC sheet, thus a multilayer body is obtained. Subsequently, the multilayer body is fired by a hot press method, and consequently, an alumina sintered body containing the heater electrode 44 is obtained. The shape and the thickness are adjusted by performing, for example, the grinding process or the blasting process on both surfaces of the obtained alumina sintered body, and the lower plate 40 that has a flat plate shape is obtained (see FIG. 5A). Green sheets may be used instead of the alumina MC sheets.

Subsequently, a second metal joining material 302 that has the same diameter as the lower plate 40 and that has a flat plate shape is placed on the upper surface of the lower plate 40, the intermediate plate 30 is placed thereon, a first metal joining material 301 that has the same diameter as the upper plate 20 and that has a flat plate shape is placed on the upper surface of the intermediate plate 30, and the upper plate 20 is placed such that the lower surface of the upper plate 20 is in contact with the second metal joining material 302. Consequently, a sandwich multilayer body is obtained with the upper plate 20 and the lower plate 40 sandwiched together with the intermediate plate 30 and with the metal joining materials 301 and 302 interposed therebetween. Subsequently, the sandwich multilayer body is compressed at a temperature equal to or less than the solidus temperature of the first and second metal joining materials 301 and 302 (for example, no less than a temperature obtained by subtracting 20° C. from the solidus temperature and no more than the solidus temperature), the upper plate 20, the intermediate plate 30, and the lower plate 40 are joined to each other by the TCB (see FIG. 513), and subsequently, the temperature is returned to the room temperature. Consequently, a joined body 80 that includes the first metal joining layer 31 changed from the first metal joining material 301 and the second metal joining layer 32 changed from the second metal joining material 302 is obtained (see FIG. 5C). This step is referred to as a step (b). An Al—Mg joining material or an Al—Si—Mg joining material can be used as the first and second metal joining materials 301 and 302. For example, in the case where the Al—Si—Mg joining material (88.5 weight % of Al, 10 weight % of Si, and 1.5 weight % of Mg are contained, and the solidus temperature is about 560° C.) is used for the TCB, the upper plate 20 is compressed for several hours at a pressure of 0.5 to 2.0 kg/mm² (for example, 1.5 kg/mm²) in a vacuum atmosphere while being heated to 540 to 560° C. (for example, 550° C.). The first and second metal joining materials 301 and 302 preferably have a thickness of about 100 μm.

Subsequently, a pattern mask to form the seal band 22a and the circular projections 22b is bonded to the wafer placement surface 22 of the upper plate 20 of the joined body 80, and a blasting medium is sprayed for the blasting process. The seal band 22a and the circular projections 22b are formed on the wafer placement surface 22 by the blasting process. This step is referred to as a step (c). Subsequently, the mask is removed, and the member 10 for semiconductor manufacturing apparatus is obtained (see FIG. 5D).

In the member 10 for semiconductor manufacturing apparatus described above in detail, the upper plate 20 that is a ceramic material plate, containing no electrode functions as a dielectric layer of the electrostatic chuck. Since the upper plate 20 contains no electrode, the upper plate 20 is easily made flat, as compared to when the upper plate 20 contains an electrode. For this reason, even when the upper plate 20 (that is, the dielectric layer) is thin, uniformity of the thickness of the upper plate 20 is improved. Thus, joining characteristics between the upper plate 20 and the intermediate plate 30 are improved, and residual stress after joining is also reduced. In addition, when a plasma is generated by applying an RF voltage to the intermediate plate 30, plasma density can be prevented from varying within the surface of the upper plate 20.

It is preferable that the thickness of the upper plate 20 be restricted to not less than 0.05 mm and not more than 1.5 mm, and be set to a value in this range, which allows desired attracting and releasing characteristics to be obtained. The electrostatic capacitance C is reduced if the upper plate 20 is thick in an RF path from the intermediate plate 30 to the upper electrode (not illustrated) through the upper plate 20 and a plasma atmosphere. When the electrostatic capacitance C is reduced, the impedance Z of the upper plate 20 is increased because the impedance Z includes a term of $1/(j\omega C)$. For this reason, when the upper plate 20 is thick, the RF loss is increased, which is disadvantageous from the viewpoint of plasma generation. In contrast, when the thickness of the upper plate 20 is set to a value within the above-mentioned range, the RF loss is decreased, which is advantageous from the viewpoint of plasma generation. The same is true when the thickness of the upper plate 20 is set to a minimum thickness for obtaining desired attracting and releasing characteristics and an electrical insulating property. The lower the frequency, the smaller the w, and the larger the value of $1/(j\omega)$, thus the effect of the electrostatic capacitance C becomes noticeable.

Furthermore, the lower plate 40 that is a ceramic material plate contains the heater electrode 44. Since the intermediate plate 30 is present between the lower plate 40 containing the heater electrode 44 and the wafer placement surface 22, heat is diffused by the intermediate plate 30 and conducted to the wafer W. Thus, the uniform thermal characteristics of the wafer W is improved.

Furthermore, the diameter of the intermediate plate 30 is larger than the diameter of the upper plate 20. Thus, a plasma generation area is expanded, as compared to when the diameter of the intermediate plate 30 is smaller than or equal to the diameter of the upper plate 20. Consequently, the wafer W is easily processed with plasma uniformly.

Furthermore, a method for manufacturing the member 10 for semiconductor manufacturing apparatus includes: (a) a step of preparing the upper plate 20 having the wafer placement surface 22 and containing no electrode, the lower plate 40 containing the heater electrode 44, and the intermediate plate 30 that is a conductive material plate; and (b) a step of disposing the first metal joining material 301 between the upper surface of the intermediate plate 30 and the lower surface (the surface opposite to the wafer placement surface 22) of the upper plate 20, disposing the second metal joining material 302 between the lower surface of the intermediate plate 30 and the upper surface of the lower plate 40, and obtaining the joined body 80 by applying heat under pressure in this state and cooling to the room temperature. This manufacturing method is suitable for producing the above-described member 10 for semiconductor manufacturing apparatus.

It goes without saying that the present invention is not limited to the above embodiment at all and can be carried out with various embodiments within the technical scope of the present invention.

Figure 6:
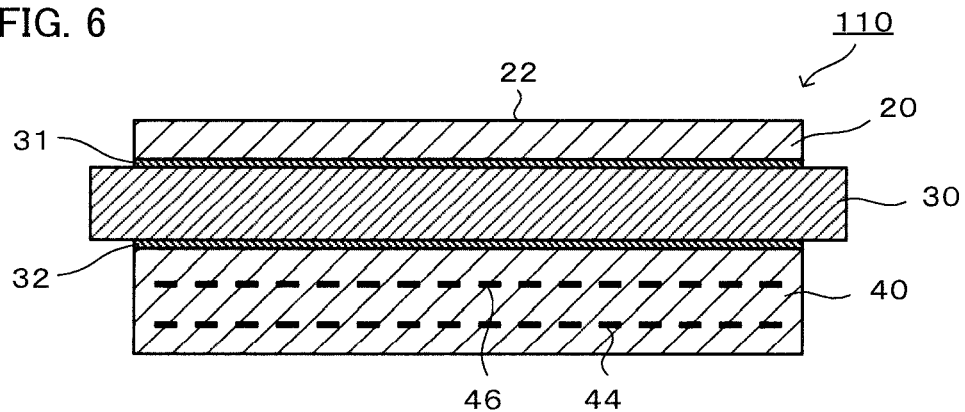
FIG. 6 is a sectional view of a member 110 for semiconductor manufacturing apparatus.

For example, as in the member 110 for semiconductor manufacturing apparatus illustrated in FIG. 6, the lower plate 40 may contain a shield electrode 46. In FIG. 6, the same components as in the embodiment described above are labeled with the same symbol. The shield electrode 46 is contained between the upper surface (the surface on which the intermediate plate 30 is provided) of the lower plate 40 and the heater electrode 44. In this manner, the shield electrode 46 prevents the RF current from flowing into the heater electrode 44, thus the RF current can be prevented from exerting an adverse effect on temperature control of the heater electrode 44.

Figure 7:
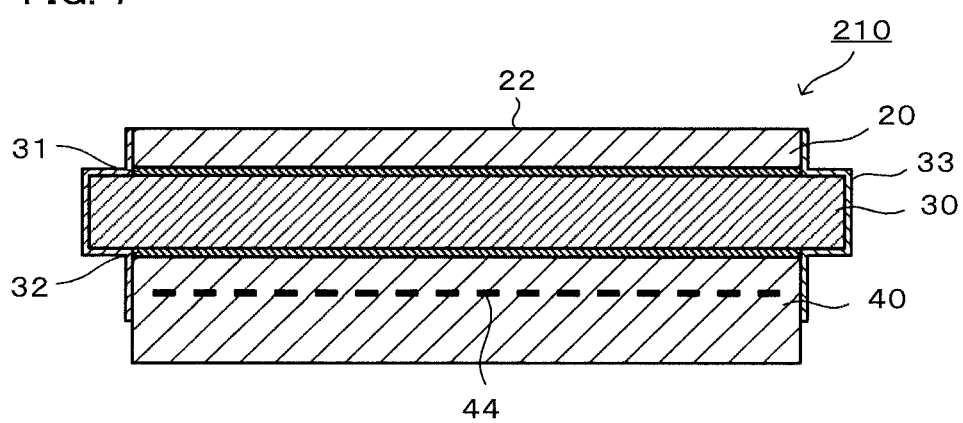
FIG. 7 is a sectional view of a member 210 for semiconductor manufacturing apparatus.

Alternatively, as in a member 210 for semiconductor manufacturing apparatus illustrated in FIG. 7, outwardly exposed faces of the intermediate plate 30, and outwardly exposed portions of the first and second metal joining layers 31, 32 may be covered with an insulating film 33. In FIG. 7, the same components as in the embodiment described above are labeled with the same symbol. An example of the insulating film 33 is a ceramic thermal spray film. In this manner, the outwardly exposed faces of the intermediate plate 30, and the outwardly exposed portions of the first and second metal joining layers 31, 32 can be prevented from corrosion.

Figure 8:
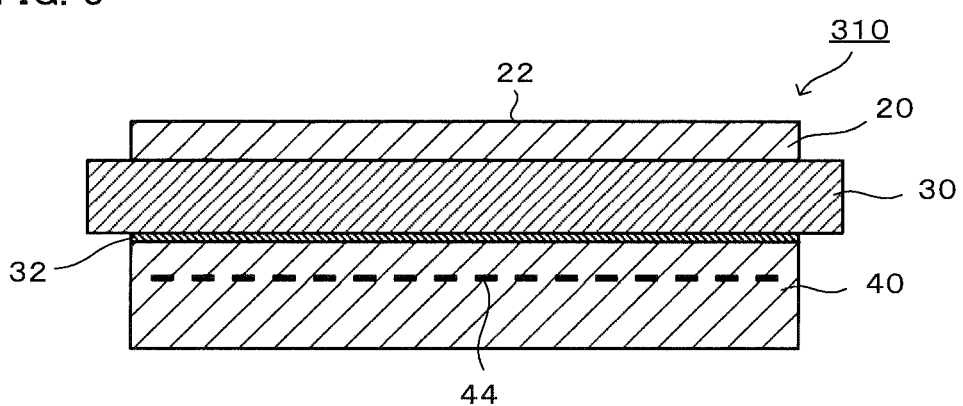
FIG. 8 is a sectional view of a member 310 for semiconductor manufacturing apparatus.

Alternatively, as in a member 310 for semiconductor manufacturing apparatus illustrated in FIG. 8, the upper plate 20 may be provided on the upper surface of the intermediate plate 30 without interposing the first metal joining layer 31 therebetween. In FIG. 8, the same components as in the embodiment described above are labeled with the same symbol. Specifically, a ceramic thermal spray film may be formed on the upper surface of the intermediate plate 30, and the ceramic thermal spray film may serve as the upper plate 20. Examples of the ceramic thermal spray film include an alumina thermal spray film and an yttria thermal spray film. An example of a method for manufacturing the member 310 for semiconductor manufacturing apparatus includes: (a) a step of forming the upper plate 20 on the upper surface of the intermediate plate 30 by thermal spray; and (b) a step of disposing a metal joining material between the lower surface of the intermediate plate 30 and the upper surface of the lower plate 40, and obtaining a joined body by applying heat under pressure in this state and cooling to the room temperature.

Figure 9:
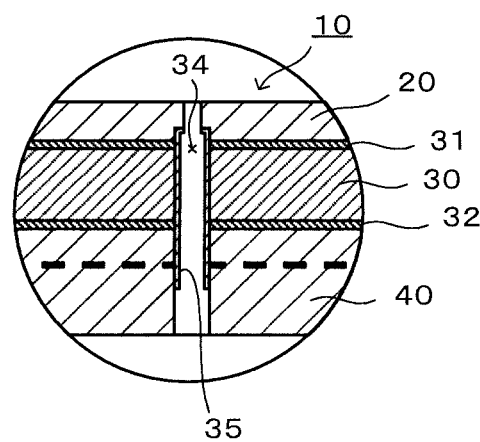
FIG. 9 is a partial sectional view illustrating an example of electrical discharge prevention treatment performed on a through-hole 34.
Figure 10:
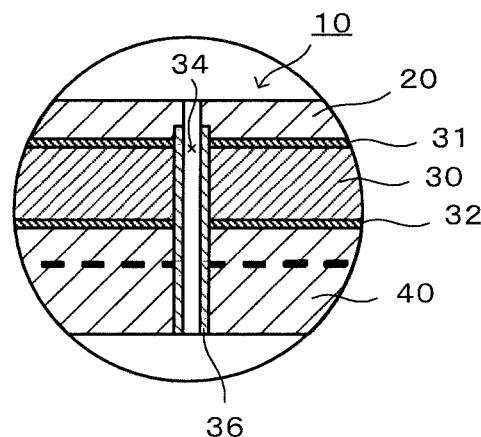
FIG. 10 is a partial sectional view illustrating an example of electrical discharge prevention treatment performed on the through-hole 34.
Figure 11:
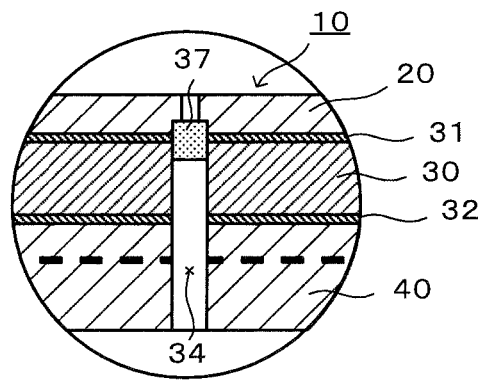
FIG. 11 is a partial sectional view illustrating an example of electrical discharge prevention treatment performed on the through-hole 34.

In the embodiment described above, as illustrated in FIGS. 9 to 11, the member 10 for semiconductor manufacturing apparatus may have the through-hole 34 that penetrates the member 10 for semiconductor manufacturing apparatus in a thickness direction, and electrical discharge prevention treatment may be already performed on the through-hole 34. For example, as illustrated in FIG. 9, of the inner wall of the through-hole 34, a portion to which the first metal joining layer 31, the intermediate plate 30 and the second metal joining layer 32 are exposed may be covered with the insulating film 35. In addition, as illustrated in FIG. 10, an insulating tube 36 may be inserted into the through-hole 34, and of the inner wall of the through-hole 34, a portion to which the first metal joining layer 31, the intermediate plate 30 and the second metal joining layer 32 are exposed may be covered with the insulating tube 36. At this point of time, the outer circumferential surface of the insulating tube 36 may be bonded and fixed with resin. When the through-hole 34 is a gas hole, as illustrated in FIG. 11, an air permeable plug 37 that is an insulating material plug may be inserted into at least a portion of the through-hole 34, the portion penetrating the upper plate 20. At this point of time, the surroundings of the air permeable plug 37 may be bonded and fixed with resin. When the configuration of FIG. 9 to FIG. 11 is used, the occurrence of electrical discharge via the through-hole 34 can be prevented while the wafer W is being processed. In FIG. 9 to FIG. 11, the same components as in the embodiment described above are labeled with the same symbol. The through-hole 34 of FIG. 9 and FIG. 10 has no particularly limited application, and may be, for example, a lift pin hole or a gas hole.

In the embodiment described above, the first metal joining layer 31 is provided between the upper plate 20 and the intermediate plate 30, and the second metal joining layer 32 is provided between the intermediate plate 30 and the lower plate 40. However, instead of these metal joining layers 31, 32, resin joining layers may be provided. An example of the resin joining layers is a silicone-based resin. The resin joining layers may be formed using a paste material or formed using a sheet material.

According to the embodiment described above, the seal band 22a and the circular projections 22b are not formed on the upper plate 20 that is prepared at the step (a). However, the seal band 22a and the circular projections 22b may be formed on the upper plate 20 by blasting process at this step. In this case, the step (c) is not needed.

According to the embodiment described above, the diameter of the upper plate 20 is equal to the diameter of the wafer W. However, the diameter of the upper plate 20 may be larger than the diameter of the wafer W, or the diameter of the upper plate 20 may be smaller than the diameter of the wafer W.

According to the embodiment described above, the heater electrode 44 is disposed so as to cover substantially the entire surface in the region of the lower plate 40 in a plan view. However, the region of the lower plate 40 in the plan view may be divided into a circular middle zone and an annular zone outside the circular middle zone, and heater electrodes may be disposed in the respective zones. The annular zone may be divided into multiple zones, and heater electrodes may be disposed in the respective divided zones.

In the embodiment described above, the lower plate 40 is provided with a single layer of the heater electrode 44. However, the lower plate 40 may be provided with multiple layers (multiple stages in the vertical direction) of the heater electrode 44.

In the embodiment described above, the lower plate 40 contains the heater electrode 44; however, the lower plate 40 may not contain a heater electrode.

EXAMPLES

Preferred examples of the present invention will now be described. The present invention is not limited by the examples below at all. Experimental examples 1 to 10 correspond to the examples of the present invention. The results thereof are illustrated in Table 1 and Table 2.

TABLE 1

| | | Experimental Example 1 | Experimental Example 2 | Experimental Example 3 | Experimental Example 4 | Experimental Example 5 |
|---|---|---|---|---|---|---|
| Upper Plate | Materials | | $Al_2O_3$ sintered body | | | $Al_2O_3$ thermal spray film |
| | Diameter (mm) | | φ300 | | | φ300 |
| | Thickness (mm) | 0.3 | 0.05 | 1.5 | 1.6 | 0.3 |
| Intermediate Plate | Materials | | SiSiCTi | | | SiSiCTi |
| | Diameter (mm) | | φ340 | | | φ340 |
| | Thickness (mm) | | 13 | | | 13 |
| Lower Plate | Materials | | $Al_2O_3$ sintered body | | | $Al_2O_3$ sintered body |
| | Diameter (mm) | | φ300 | | | φ300 |
| | Thickness (mm) | | 3 | | | 3 |
| Attracting Force (Torr) | | | ≥50 | | | ≥50 |
| Electrostatic Capacitance (nF) | | 21 | 125.1 | 4.2 | 3.9 | 21 |

TABLE 2

| | | Experimental Example 6 | Experimental Example 7 | Experimental Example 8 | Experimental Example 9 | Experimental Example 10 |
|---|---|---|---|---|---|---|
| Upper Plate | Materials | AlN sintered body | | | AlN thermal spray film | |
| | Diameter (mm) | φ300 | | | φ300 | |
| | Thickness (mm) | 0.5 | 0.05 | 0.3 | 1.5 | 1.6 |
| Intermediate Plate | Materials | Mo | | | Mo | |
| | Diameter (mm) | φ340 | | | φ340 | |
| | Thickness (mm) | 13 | | | 13 | |
| Lower Plate | Materials | AlN sintered body | | | AlN sintered body | |
| | Diameter (mm) | φ300 | | | φ300 | |
| | Thickness (mm) | 3 | | | 3 | |

TABLE 2-continued

| | Experimental Example 6 | Experimental Example 7 | Experimental Example 8 | Experimental Example 9 | Experimental Example 1 0 |
|---|---|---|---|---|---|
| Attracting Force (Torr) | ≥50 | | ≥50 | | |
| Electrostatic Capacitance (nF) | 11 | 112.6 | 18.8 | 3.8 | 3.5 |

Experimental Example 1

The member 10 for semiconductor manufacturing apparatus according to the embodiment described above was manufactured by the manufacturing method described above. The materials and dimensions of the upper plate 20, the intermediate plate 30 and the lower plate 40 are as shown in Table 1. After the upper plate 20, the intermediate plate 30 and the lower plate 40 were each manufactured, the first metal joining material 301 was disposed between the upper plate 20 and the intermediate plate 30, and the second metal joining material 302 was disposed between the lower plate 40 and the intermediate plate 30. The upper plate 20, the intermediate plate 30, and the lower plate 40 were joined to each other by the TCB. Al—Si—Mg joining materials were used as the first and second metal joining materials 301 and 302. In experimental example 1, in order to obtain the desired attracting and releasing characteristics and the electrical insulating property of the wafer W, the thickness of the upper plate 20 that is an alumina material plate was set to 0.3 mm.

Because the upper plate 20 contains no electrode, deformation of the upper plate 20 before joining was not observed, and the joining characteristics at the time of subsequent TCB joining was favorable, and the residual stress after joining was also removed. In addition, management of the distance from the intermediate plate 30 which functions as the electrostatic electrode and the RF electrode to the upper surface of upper plate 20 was simplified. Furthermore, the RF loss reduced because the electrostatic capacitance of the upper plate 20 increased in the RF path from the intermediate plate 30 to the upper electrode (not illustrated) through the upper plate 20 and a plasma atmosphere. For this reason, it is also possible to cope with application of low frequency RF. In an experiment in which the thickness of the upper plate 20 was changed from 0.3 mm to 3 mm, the electrostatic capacitance of the upper plate was only 10% of that of experimental example 1, thus the RF loss increased.

Experimental Examples 2 to 4

In experimental examples 2 to 4, the member 10 for semiconductor manufacturing apparatus was manufactured in the same manner as in experimental example 1 except that the thickness of the upper plate 20 was changed as in Table 1. In also experimental examples 2 to 4, because the upper plate 20 contains no electrode, deformation of the upper plate 20 before joining was not observed, and the joining characteristics at the time of subsequent TCB joining was favorable, and the residual stress after joining was also removed. In addition, management of the distance from the intermediate plate 30 which functions as the electrostatic electrode and the RF electrode to the upper surface of upper plate 20 was simplified. Furthermore, the RF loss reduced because the electrostatic capacitance of the upper plate 20 increased in the RF path from the intermediate plate 30 to the upper electrode (not illustrated) through the upper plate 20 and a plasma atmosphere. For this reason, it is also possible to cope with application of low frequency RF. However, in experimental example 4, the thickness of the upper plate 20 exceeded 1.5 mm, thus the electrostatic capacitance decreased as compared to experimental examples 1 to 3. Therefore, the thickness of the upper plate 20 is preferably not less than 0.05 mm and not more than 1.5 mm.

Experimental Example 5

The above-described member 310 for semiconductor manufacturing apparatus (see FIG. 8) was manufactured under the conditions shown in experimental example 5 of Table 1. In experimental example 5, the upper plate 20 was formed on the upper surface of the intermediate plate 30 by thermal spray, a metal joining material was disposed between the lower surface of the intermediate plate 30 and the upper surface of the lower plate 40, and TCB joining was performed.

In also experimental example 5, because the upper plate 20 contains no electrode, deformation of the upper plate 20 before joining was not observed, and the joining characteristics at the time of subsequent TCB joining was favorable, and the residual stress after joining was also removed. In addition, management of the distance from the intermediate plate 30 which functions as the electrostatic electrode and the RF electrode to the upper surface of upper plate 20 was simplified. Furthermore, the RF loss reduced because the electrostatic capacitance increased in the RF path from the intermediate plate 30 to the upper electrode (not illustrated) through the upper plate 20 and a plasma atmosphere. For this reason, it is also possible to cope with application of low frequency RF. The member 310 for semiconductor manufacturing apparatus with the thickness of the upper plate 20 of the alumina thermal spray film changed to 0.05 mm, 1.5 mm, 1.6 mm was manufactured according to experimental example 5 and evaluated. Then the same effects as in the experimental examples 2 to 4 were obtained.

Experimental Example 6

The member 10 for semiconductor manufacturing apparatus according to the embodiment described above was manufactured in the same manner as in experimental example 1 under the conditions shown in experimental example 6 of Table 2. In experimental example 6, in order to obtain the desired attracting and releasing characteristics and the electrical insulating property of the wafer W, the thickness of the upper plate 20 that is an AlN material plate was set to 0.5 mm.

In also experimental example 6, because the upper plate 20 contains no electrode, deformation of the upper plate 20 before joining was not observed, and the joining characteristics at the time of subsequent TCB joining was favorable, and the residual stress after joining was also removed. In addition, management of the distance from the intermediate plate 30 which functions as the electrostatic electrode and the RF electrode to the upper surface of upper plate 20 was simplified. Furthermore, the RF loss reduced because the electrostatic capacitance increased in the RF path from the intermediate plate 30 to the upper electrode (not illustrated) through the upper plate 20 and a plasma atmosphere. For this reason, it is also possible to cope with application of low frequency RF. In an experiment in which the thickness of the upper plate 20 was changed from 0.5 mm to 3 mm, the electrostatic capacitance was only about 17% of that of experimental example 6, thus the RF loss increased.

Experimental Examples 7 to 10

In experimental examples 7 to 10, the member 310 for semiconductor manufacturing apparatus was manufactured in the same manner as in experimental example 5 except that AlN was used as the material of the upper plate 20 and the lower plate 40, and the thickness of the upper plate 20 was changed as in Table 2. In also experimental examples 7 to 10, because the upper plate 20 contains no electrode, deformation of the upper plate 20 before joining was not observed, and the joining characteristics at the time of subsequent TCB joining was favorable, and the residual stress after joining was also removed. In addition, management of the distance from the intermediate plate 30 which functions as the electrostatic electrode and the RF electrode to the upper surface of upper plate 20 was simplified. Furthermore, the RF loss reduced because the electrostatic capacitance of the upper plate 20 increased in the RF path from the intermediate plate 30 to the upper electrode (not illustrated) through the upper plate 20 and a plasma atmosphere. For this reason, it is also possible to cope with application of low frequency RF. However, in experimental example 10, the thickness of the upper plate 20 exceeded 1.5 mm, thus the electrostatic capacitance decreased as compared to experimental examples 6 to 9. Therefore, the thickness of the upper plate 20 is preferably not less than 0.05 mm and not more than 1.5 mm.

The present application claims priority from Japanese Patent Application No. 2021-016207, filed on Feb. 4, 2021, the entire contents of which are incorporated herein by reference.

What is claimed is:

1. A member for semiconductor manufacturing apparatus, comprising:
   an upper plate that has a wafer placement surface, contains no electrode, and is a ceramic material plate;
   an intermediate plate that is provided on a surface of the upper plate, opposite to the wafer placement surface, that functions as an electrostatic electrode and an RF electrode, and that is a conductive material plate; and
   a lower plate that is joined to a surface of the intermediate plate, opposite to a surface on which the upper plate is provided, and that is a ceramic plate;
   wherein the intermediate plate is a metal plate comprising titanium or molybdenum or a metal-ceramic-composite (metal matrix composite) material plate;
   wherein the lower plate contains a heater electrode; and
   wherein the lower plate contains a shield electrode between a surface on which the intermediate plate is provided and the heater electrode.

2. The member for semiconductor manufacturing apparatus according to claim 1,
   wherein a thickness of the upper plate is not less than 0.05 mm and not more than 1.5 mm.

3. The member for semiconductor manufacturing apparatus according to claim 1,
   wherein a diameter of the intermediate plate is larger than a diameter of the upper plate.

4. The member for semiconductor manufacturing apparatus according to claim 1,
   wherein an outwardly exposed face of the intermediate plate is covered with an insulating film.

5. The member for semiconductor manufacturing apparatus according to claim 1,
   wherein the lower plate and the upper plate are same ceramic material plates.

6. The member for semiconductor manufacturing apparatus according to claim 1,
   wherein the member for semiconductor manufacturing apparatus has a through-hole that penetrates the member for semiconductor manufacturing apparatus in a thickness direction, and
   electrical discharge prevention treatment is already performed on the through-hole.

7. The member for semiconductor manufacturing apparatus according to claim 1,
   wherein the metal-ceramic-composite (metal matrix composite) material plate comprises SiSiCTi or a SiC porous body impregnated with aluminum, silicon, or a combination thereof.

8. A method for manufacturing a member for semiconductor manufacturing apparatus, the method comprising:
   (a) a step of preparing an upper plate that has a wafer placement surface, contains no electrode, and is a ceramic material plate, a lower plate that is a ceramic plate including a heater electrode and a shield electrode, and an intermediate plate that functions as an electrostatic electrode and an RF electrode and that is a conductive material plate, wherein the conductive material plate is a metal plate comprising titanium or molybdenum or a metal-ceramic-composite (metal matrix composite) material plate;
   wherein the shield electrode in the lower plate is between a surface on which the intermediate plate is provided and the heater electrode; and
   (b) a step of disposing a first metal joining material between an upper surface of the intermediate plate and a surface of the upper plate, opposite to the wafer placement surface, disposing a second metal joining material between a lower surface of the intermediate plate and an upper surface of the lower plate, and obtaining a joined body by applying heat under pressure in a current state and cooling to a room temperature.

9. The method according to claim 8,
   wherein the metal-ceramic-composite (metal matrix composite) material plate comprises SiSiCTi or a SiC porous body impregnated with aluminum, silicon, or a combination thereof.

10. A method for manufacturing a member for semiconductor manufacturing apparatus, the method comprising:
    (a) a step of forming an upper plate that contains no electrode and that is a ceramic material plate by thermal spray on an upper surface of an intermediate plate that functions as an electrostatic electrode and an RF electrode and that is a conductive material plate,
    wherein the conductive material plate is a metal plate comprising titanium or molybdenum or a metal-ceramic-composite (metal matrix composite) material plate; and
    (b) a step of disposing a metal joining material between a lower surface of the intermediate plate and an upper surface of a lower plate that is a ceramic material plate including a heater electrode and a shield electrode, wherein the shield electrode in the lower plate is between a surface on which the intermediate plate is provided and the heater electrode; and obtaining a joined body by applying heat under pressure in a current state and cooling to a room temperature.

11. The method according to claim 10,
wherein the metal-ceramic-composite (metal matrix composite) material plate comprises SiSiCTi or a SiC porous body impregnated with aluminum, silicon, or a combination thereof.

* * * * *